United States Patent
Nishihori et al.

[19]

[11] Patent Number: 6,114,195

[45] Date of Patent: Sep. 5, 2000

[54] MANUFACTURING METHOD OF COMPOUND SEMICONDUCTOR FIELD EFFECT TRANSISTOR

[75] Inventors: Kazuya Nishihori, Tokyo-to; Yoshiaki Kitaura, Kawasaki; Naotaka Uchitomi, Tokyo-to, all of Japan

[73] Assignee: Kabushiki Kaisha Toshiba, Kawasaki, Japan

[21] Appl. No.: 09/192,575

[22] Filed: Nov. 17, 1998

Related U.S. Application Data

[62] Division of application No. 08/968,854, Nov. 5, 1997, which is a continuation of application No. 08/501,209, Jul. 11, 1995, abandoned.

[30] Foreign Application Priority Data

| Jul. 11, 1994 | [JP] | Japan | 6-158826 |
| Jul. 6, 1995 | [JP] | Japan | 7-171162 |

[51] Int. Cl.[7] .................................................. H01L 21/338
[52] U.S. Cl. ........................................................... 438/180
[58] Field of Search ........................... 438/142, 167, 438/174, 180, 181, 184

[56] References Cited

U.S. PATENT DOCUMENTS

| 4,980,731 | 12/1990 | Hilda | 257/192 |
| 5,031,007 | 7/1991 | Chaffin et al. | 257/192 |
| 5,272,365 | 12/1993 | Nakagawa | 257/192 |
| 5,351,128 | 9/1994 | Goto et al. | 257/192 |
| 5,532,505 | 7/1996 | Kuwata | 257/269 |

FOREIGN PATENT DOCUMENTS

| 60-254672 | 12/1985 | Japan . |
| 62-286284 | 12/1987 | Japan . |
| 2-098945 | 4/1990 | Japan . |

OTHER PUBLICATIONS

Nishihori et al., A self–aligned gate Al/GaAs/GaAs heterostructure field–effect transistor with an ion–implanted buried–channel for use in high efficiency power amplifiers, Jpn. J. Appl. Phys. vol. 37, pp 3200–3204, Jun. 1998.

*Primary Examiner*—Charles Bowers
*Assistant Examiner*—Keith Christianson
*Attorney, Agent, or Firm*—Foley & Lardner

[57] ABSTRACT

A manufacturing method of compound semiconductor field effect transistor capable of enhancing a gate/drain withstand voltage includes a step of forming a channel layer by implanting ions into the surface of a semi-insulating compound semiconductor substrate and a step of performing a first thermal treatment for removing crystalline defects on the surface of the channel layer. This method also includes a step of forming a compound semiconductor epitaxial layer by use of an epitaxial method on a region covering the channel layer, a step of forming a gate electrode within a region on the epitaxial layer just above the channel layer and a step of forming a source region and a drain region in the substrate. A concentration of the impurity for forming the channel layer at an interface between the channel layer and the epitaxial layer is 45% or under of the highest concentration when forming the channel layer. A good interface between the channel layer and the epitaxial layer can be thereby obtained, and a transistor having the high-quality epitaxial layer can be also acquired.

11 Claims, 5 Drawing Sheets

MANUFACTURING METHOD OF COMPOUND SEMICONDUCTOR FIELD EFFECT TRANSISTOR

This application is a divisional of application Ser. No. 08/968,854, filed Nov. 5, 1997, which is a continuation of application Ser. No. 08/501,209, filed Jul. 11, 1995 now abandoned.

BACKGROUND OF THE INVENTION

1. Field of the Invention

The present invention relates to a compound semiconductor field effect transistor and a manufacturing method thereof.

2. Description of the Related Background Art

In the recent several years, with the highly-sophisticated and globalized tendency of information, attention has been focused on a mobile communication system in terms of its usability and economical efficiency. In this system, a cordless telephone used on L-band (one frequency band among frequency bands having 1 GHz or higher employed in the mobile communication system) exhibits an abrupt increase in demand. In this cordless telephone, a MMIC (Microwave Monolithic Integrated Circuit) using a compound semiconductor field-effect transistor comprised of a GaAs substrate, etc. is highly desirable.

Further, for obtaining a downsized cordless telephone and a reduction in costs thereof, it is of importance to promote a high integration of the MMIC. Especially, realizing a one-chip front end MMIC in which both a high power output amplifier and a low-noise amplifier of an front end portion are formed on a same chip is important in terms of attaining the downsizing and the reduction in costs of the cordless telephone. It is also of importance for manufacturing such an MIC that the costs are sufficiently low and stability of the manufacturing process is established.

At present, the most popular type of active device for the MMIC is a Schottky junction type field-effect transistor (hereinafter abbreviated to FET) formed of a compound semiconductor substrate. Two known methods of manufacturing this FET are the ion implantation method and the epitaxial method. The ion implantation method has such advantages that the costs are low, element isolation is not required, and a plurality of FETs having different threshold voltages can be simultaneously formed on the same chip.

On the other hand, the epitaxial method has advantages in which a FET having a complicated structure can be formed, and therefore the FET exhibiting a high performance can be obtained. A determination of which process to use depends on the application of the device to be manufactured. In the case of the MMIC in which a multiplicity of FET elements are formed on the same chip, however, there is a tendency to use the ion implantation method. Particularly a self-alignment FET process in which a heat resistant metal is employed for a gate electrode is excellent in terms of a controllability of the threshold voltage and is therefore suited to manufacture an IC. However, a high integration of the MMIC such as a one-chip front end MMIC has been proceeding in recent years. The transistor therein has required a high performance, especially a high gate to drain withstand voltage BV, a high mutual conductance $g_m$ and an excellent low-noise characteristic.

The gate/drain withstand voltage is determined based on a carrier concentration of a semiconductor layer contiguous to the gate electrode and becomes higher with a lower carrier concentration. In case the ion implantation method is used, the withstand voltage is increased by decreasing the dose of the ion implantation or augmenting an acceleration voltage to lower the surface concentration. In this case, however, the withstand voltage is not improved as expected with the reduction of mutual conductance $g_m$, and as a result there is a limitation in the ion implantation method.

On the other hand, when using the epitaxial method, the degree of freedom to form a complicated structure increases greatly, and therefore a structural design to exhibit a performance responding to a request can be attained. There arise, however, a problem inherent in the epitaxial method when manufacturing the IC constructed of a transistor having two or more kinds of threshold voltages, and it is difficult to actualize the highly integrated MMIC.

For obviating the above-mentioned problems, there can be considered a process in which the ion implantation method and the epitaxial method are combined. That is, the channel layer is formed by the ion implantation method, and the epitaxial layer is formed thereon. The transistor manufactured by this process has an buried channel structure in which the channel is buried. This buried channel structure, because of the channel layer being formed by a selective ion implantation, makes it possible to easily form a plurality of FETs having different threshold voltages on the same ship. Further, there is no necessity for a special process for securing an element-to-element electric insulating property, and, in this respect, the buried channel structure is suited to MMIC applications.

Examples of thus combining the ion implantation method with the epitaxial method are disclosed in Japanese Patent Laid-Open Publication Nos. 62-286284 and 2-98945.

According to the Japanese Patent Laid-Open Publication No. 62-286284, there is disclosed a method in which an ion-implanted layer is formed by implanting ions into a GaAs substrate; an undoped GaAs film is epitaxial-grown on this ion-implanted layer; an anneal for electrically activating the above ion-implanted layer is effected thereafter; and, subsequently, a gate electrode is formed on the undoped GaAs film. In the thus formed FET, it is possible to prevent a dissociation of GaAs in a thermal treatment process with the GaAs film serving as a cap material (protective film), and, besides, because of the cap material being composed of GaAs, a diffusion of Ga from the substrate into the cap layer is also prevented. As a result, a composition of an active layer surface portion formed by the ion implantation does not deviate form a stoichiometric composition, and a GaAs MESFET exhibiting a small fluctuation in threshold value can be obtained.

If a Schottky gate electrode is formed on the remaining GaAs with a film serving as a cap material being left, source and drain regions are formed with this gate electrode serving as a mask, and an impurity is ion-implanted with a high concentration, thereby forming source and drain regions, the impurity in the source and drain regions can be restrained from diffusing just down from the channel region, and the short channel effect can be thereby restrained.

The inventors of the present invention, however, clarified that this method exerts an adverse influence on the operating characteristic. This will be explained later.

On the other hand, according to Japanese Patent Laid-Open Publication No. 2-98945, there is proposed a FET structure in which the ion-implanted layer is formed on an InP substrate; an anneal (protect film annealing) for electrically activating the ion-implanted layer is effected with this ion-implanted layer covered with a protect film; the protect film is thereafter peeled off; an epitaxial layer composed of $Al_xGa_{1-x}As$ is formed; and a gate electrode is formed on this $Al_xGa_{1-x}$ layer. The substrate composed of InP employed according to this proposal is much more expensive than the GaAs substrate, and it is therefore impossible to attain the reduction in costs by MMIC applications. Further, according to this proposal, the protect film annealing (cap annealing) is employed as an anneal of the ion-implanted layer. In the case of using this protect film annealing, however, the ion-implanted layer surface with a small amount of crystalline defects can not be obtained. The reason is that a multiplicity of crystalline defects exist on the surface of the ion-implanted layer due to the fact that the protect film and ion-implanted layer react on each other at an interface therebetween, and the protect film is exfoliated according to the protect film annealing method. Even when the epitaxial layer is grown on the ion-implanted layer surface on which the multiplicity of crystalline defects exist, the multiplicity of crystalline defects still exist in the vicinity of the interface of the epitaxial layer, and a good interface, i.e., a good electric characteristic can not be obtained.

SUMMARY OF THE INVENTION

It is a primary object of the present invention, which was devised under such circumstances, to provide a compound semiconductor field effect transistor and a manufacturing method thereof that are capable of enhancing a gate/drain withstand voltage as much as possible even when integrated.

According to the first aspect of the present invention, there is provided a compound semiconductor field effect transistor comprising:

a channel layer formed by implanting ions into the surface of a semi-insulating compound semiconductor substrate;

a compound semiconductor epitaxial layer formed by an epitaxial method on a region covering said channel layer;

a gate electrode formed within a region on said epitaxial layer just above said channel layer;

source and drain regions formed in said substrate; and source and drain electrodes formed on said source and drain regions, wherein a concentration of an impurity at an interface of said compound semiconductor epitaxial layer between said channel layer and said compound semiconductor epitaxial layer is 45% or under of a highest concentration of said channel layer.

According to the thus constructed compound semiconductor field effect transistor of the present invention, a concentration an impurity for forming a channel layer at an interface of an epitaxial layer between the channel layer and an epitaxial layer is 45% or under of a highest concentration when forming the channel layer. A thermally stable interface is thereby obtainable, and a high-quality, i.e., a high-resistance epitaxial layer can be also obtained. A gate/drain withstand voltage can be enhanced, and, when incorporated into a circuit, a predetermined threshold value can be obtained.

Furthermore, according to the second aspect of the present invention, there is provided a method of manufacturing a compound semiconductor field effect transistor comprising the steps of:

forming a channel layer by implanting ions into the surface of a semi-insulating compound semiconductor substrate;

performing a first thermal treatment for removing crystalline defects on the surface of said channel layer;

forming a semiconductor epitaxial layer by use of an epitaxial method on a region covering said channel layer;

forming a gate electrode within a region on said epitaxial layer just above said channel layer; and forming source and drain regions in said substrate.

According to a first mode of a method of manufacturing the thus constructed compound semiconductor field effect transistor of the present invention, before forming the epitaxial layer, a thermal treatment for removing crystalline defects on the surface of the ion-implanted layer is conducted. With this process, no crystalline defect is produced in the vicinity of the interface of the epitaxial layer formed thereafter, and a pile-up of the impurity from the ion-implanted layer is not caused either. Accordingly, the epitaxial layer has a high resistance, and the gate/drain withstand voltage is more enhanced than in the conventional cases.

According to a second mode of the method of manufacturing the thus constructed compound semiconductor field effect transistor of the present invention, the source and drain regions are formed by the ion implantation using a gate electrode serving as a mask in the manufacturing method according to the first aspect. The impurities in the source and drain regions are thereby restrained from diffusing under a channel region, and a short channel effect when gate-shortened can be also restrained.

According to a third mode of the method of manufacturing the thus constructed compound semiconductor field effect transistor of the present invention, an impurity regions having a lower concentration than the source region is formed between the source region and the gate electrode. With this process, a source resistance is reduced, and, besides, a high gate/drain withstand voltage can be obtained.

According to a fourth mode of the method of manufacturing the thus constructed compound semiconductor field effect transistor of the present invention, a substrate is a GaAs substrate, and, before forming the epitaxial layer, a thermal treatment for removing the crystalline defects on the surface of the channel layer is conducted at a predetermined temperature with no protect film. With this process, the crystalline defects are not produced in the vicinity of the interface of the epitaxial layer formed thereafter, and the pile-up of the impurity from the channel layer is not also produced. Hence, the epitaxial layer exhibits a high resistance, and the gate/drain withstand voltage is more enhanced than in the conventional cases. Further, the costs are reduced because of using the GaAs substrate.

According to a fifth mode of the method of manufacturing the thus constructed compound semiconductor field effect transistor of the present invention, the impurity in the case of forming the channel layer is Si in the manufacturing method according to the fourth aspect, and a dose of the order of $5 \times 10^{13}$ cm$^{-2}$ or under is used. The crystalline defects on the surface of the channel layer formed by this ion implantation are thereby all removed by the anneal for removing the crystalline defects, and a good interface between the channel layer and the epitaxial layer can be obtained.

According to a sixth mode of the method of manufacturing the thus constructed compound semiconductor field effect transistor of the present invention, the epitaxial layer is composed of any one of materials such as i-GaAs, i-$Al_xGa_{1-x}As$/i-$In_xGa_{1-x}As$, P-type GaAs, or P-type $Al_xGa_{1-x}As$. A good noise characteristic can be thereby obtained.

According to a seventh mode of the method of manufacturing the thus constructed compound semiconductor field effect transistor of the present invention, the ion-implanted layer and the source and drain regions are electrically activated by a second thermal treatment. A good diffused layer is thereby obtainable.

BRIEF DESCRIPTION OF THE DRAWINGS

Other objects and advantages of the present invention will become apparent during the following discussion in conjunction with the accompanying drawings, in which.

DESCRIPTION OF THE PREFERRED EMBODIMENTS

Figure 1A:
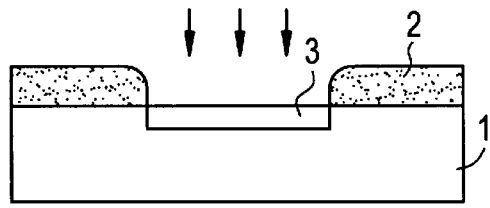
FIGS. 1A–1I are sectional views illustrating steps of a manufacturing process according to a first embodiment of a method of manufacturing a compound semiconductor field effect transistor of the present invention.
Figure 1B:
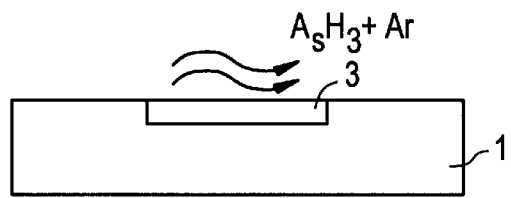

A first embodiment of a method of manufacturing a compound semiconductor field effect transistor (hereinafter simply termed also a transistor) according to the present invention will be described with reference to FIGS. 1A–1I and 2. FIGS. 1A–1I illustrate manufacturing processes thereof. To start with, a photo resist layer 2 is coated on a semi-insulating GaAs substrate 1, and this photo resist layer 2 is subjected to patterning (see FIG. 1A). Then, an impurity (e.g., Si) is implanted into the substrate 1 under such condition that a dose is on the order of $5.5 \times 10^{12}$ cm$^{-2}$, and an acceleration voltage is 25 KeV, wherein this photo resist layer 2 that has undergone the patterning serves as a ion implantation mask. An ion-implanted layer 3 serving as an n-type channel layer is thus formed (see FIG. 1A). Next, after removing the photo resist layer 2, for restoring the crystallinity defect by the ion implantation, a thermal treatment (annealing) is conducted at a predetermined temperature for approximately 20 minutes in an AsH$_3$ atmosphere (see FIG. 1B).

This annealing aims at eliminating crystalline defects on the surface of the ion-implanted layer (n-type channel layer) 3 but is a bit different in terms of a treatment temperature and a treatment time from an anneal normally performed for simply electrically activating the impurity in the ion-implanted layer. That is, from a point of view of uniformizing a characteristic of an element formed on the entire surface of a large-diameter wafer, an electric furnace annealing is superior to RTA (Rapid Thermal Anneal) using a lamp, etc., and the electric furnace annealing under an As pressure simply for the purpose of the activation can be done up to 900° C. A higher activation factor can be obtained at a higher temperature within this range, and, hence the anneal treatment at the higher temperature is desirable.

In contrast with this, according to the annealing in the embodiment of the present invention that aims at removing the crystalline defects on the surface of the ion-implanted layer, if annealed at a temperature of 850° C. or higher, a dissociation of As from the surface is caused, with the result that the purpose can not be accomplished. It is therefore required that the annealing be performed at 850° C. or under. Further, in the case of the annealing simply for the activation, if an annealing temperature is 750° C. or under, the impurity is not sufficiently activated, and this is therefore improper. If over 700° C., however, the annealing aiming at removing the crystalline defects on the surface is capable of attaining the purpose thereof. Accordingly, it is desirable that the annealing temperature be set at 700–850° C. in the embodiment of the present invention.

Note that applying the As pressure on the substrate surface generally involves the use of an AsH$_3$ gas. The AsH$_3$ is thermally decomposed at 500° C. or higher, resulting in a generation of an As gas. Annealing at 820° C. for 20 minutes entails an As pressure on the order of 3.4 Torr. A base gas used at this time may be an Ar gas or an H$_2$ gas. Any of these gases may be employed as a base gas in an ordinary activating anneal treatment. The anneal for removing the crystalline defects on the surface of the ion-implanted layer entails the use of the Ar gas as a base gas. Because, when using the H$_2$ gas as a base gas, As on the surface of the ion-implanted layer is combined with H$_2$ into AsH$_3$, thereby causing the dissociation of As from the substrate surface. Consequently, the defects are also introduced into an epitaxial layer grown afterward on the substrate, and it is impossible to secure a thermal stability of an interface between the ion-implanted layer and the epitaxial layer.

The epitaxial growth is conducted after the anneal treatment in order to remove the crystalline defects described above, however, because of being exposed in the air before the epitaxial growth, an oxide film is to be formed on the surface of the ion-implanted layer 3. If the epitaxial growth is conducted as it is, a good interface can not be formed. Effected then is a treatment for removing the oxide before the epitaxial growth.

The following is the treatment for removing the oxide. First, an oxide of Ga on the surface of the ion-implanted layer 3 is removed by use of a solution of ammonium fluoride or hydrochloric acid. Subsequently, the oxide of As on the surface of the ion-implanted layer is removed, and, for this purpose, the thermal treatment is effected at 200° C. under a pressure on the order of 10$^{-5}$ Torr or lower. The oxide of As is completely sublimated when heated at this temperature of 200° C.

Figure 1C:
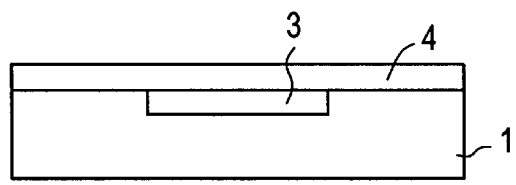
Figure 1D:
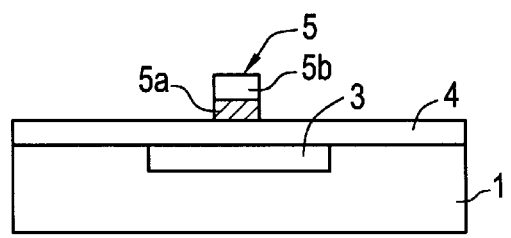
Figure 1E:
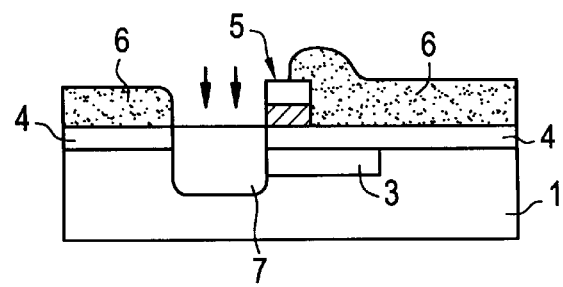
Figure 1F:
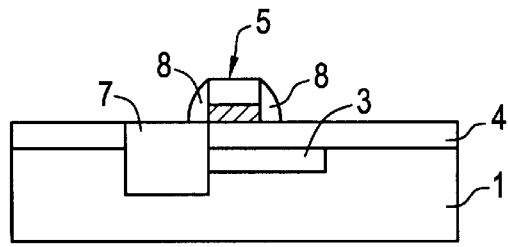

Next, an epitaxial layer 4 that is 10–20 nm thick is formed on the entire surface by an MOCVD (Metal Organic Chemical Vapor Deposition) method or an MBE (Molecular Beam Epitaxy) method (see FIG. 1C). This epitaxial layer 4 is composed of GaAs (i-GaAs) or Al$_x$Ga$_{1-x}$As (i-Al$_x$Ga$_{1-x}$As) ($0.2 \leq x \leq 0.28$) doped with no impurity. Deposited subsequently sequentially are a layer 5a composed of tungsten nitride (WN$_x$) having a thickness 120 nm and a layer composed of tungsten (W) having a thickness of 300 nm, and patterning is effected, thereby forming a heat resistant double-layered gate electrode 5 within a predetermined region on the epitaxial layer 4 on the n-type channel layer 3 (see FIG. 1D). Thereafter, a photo resist layer 6 is coated thereon and then subjected to patterning. With this photo resist layer 6 undergoing the patterning and the gate electrode serving as ion implantation masks, an n-type impurity (e.g., Si) is ion-implanted, and an N' intermediate concentration layer 7 deeper than the n-type channel layer 3 is thereby formed in a predetermined source forming region (see FIG. 1E). Subsequently, after removing the photo resist layer 6, for instance, an SiO$_2$ layer is deposited, and a side wall 8 composed of $SiO_2$ is formed along the side portion of the gate electrode 5 by anisotropic etching (see FIG. 1F).

Figure 1G:
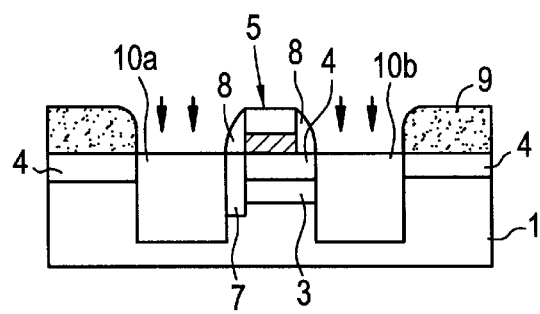
Figure 1H:
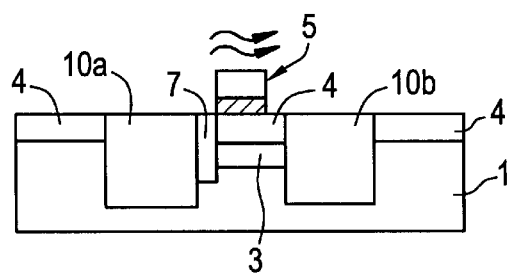

Next, after the photo resist layer 9 has been again coated, this photo resist layer 9 is subjected to patterning, and, with this photo resist layer 9 undergoing the patterning, the gate electrode 5 and the side wall serving as masks, the impurity (e.g., Si) is ion-implanted, thus forming $n^+$ regions defined as a source region 10a and a drain region 10b but exhibiting a higher concentration than the n' intermediate concentration layer 7 (see FIG. 1G). Thereafter, the side wall 8 and the photo resist layer 9 are removed, and the thermal treatment (annealing) is carried out in a predetermined temperature in an $AsH_3$ atmosphere. Then, the ion-implanted n' intermediate concentration layer 7, the source region 10a and the drain region 10b are activated (see FIG. 1H).

Figure 1I:
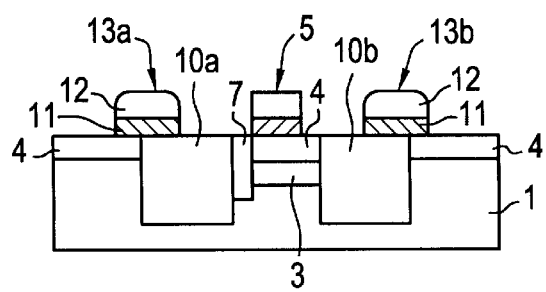

Next, a source electrode 13a and a drain electrode 13b that are composed of an AuGe layer 11 and an Au layer 12 are formed on a region inclusive of the source region 10a and the drain region 10b by use of a lift-off method (see FIG. 1I). A transistor is thus completed.

Now, supposing that a gate voltage when a backward gate/drain current per gate width of 20 μm becomes 330 nA is defined as a gate/drain withstand voltage, the gate/drain withstand voltage of the transistor manufacture in this embodiment is 7.4 V, wherein its epitaxial layer 4 composed of i-GaAs is 20 nm thick. Taking into consideration the fact that a withstand voltage of a transistor having no epitaxial layer is confined down to 4.0 V, it follows that an improved effect of 3 V or above is to be obtained. Assuming that a power voltage in use is, e.g., 2.7 V, it follows that there is an allowance that is substantially twice or more, and a reliability when applied as a power FET is remarkably improved. Note that the gate/drain withstand voltage is 8.5 V further enhanced by 1 when $i-Al_xGa_{1-x}$ having a larger band gap than i-GaAs is used for the epitaxial layer 4.

As discussed above, the improvement of the gate/drain withstand voltage is, it can be considered, derived from the fact that the high-resistance epitaxial layer 4 is formed between the n-type channel layer 3 and the gate electrode 5, and the anneal treatment is performed to remove the crystalline defects on the surface of the ion-implanted layer (n-type channel layer 3) before forming this epitaxial layer 4.

In contrast with this, if the epitaxial layer is formed without effecting the anneal for removing the crystalline defects on the surface of the ion-implanted layer, the gate/drain withstand voltage remains substantially the same as having no epitaxial layer or drops down. This implies that when epitaxial-grown on the ion-implanted layer containing many defects, the epitaxial layer also contains many defects in the vicinity of the interface because of undergoing an influence by the surface of the ion-implanted layer. Then, if the anneal for activating the ion-implanted layer or the like is conducted thereafter, Si atoms defined as an impurity within the ion-implanted layer are attracted close to the interface due to the above defects during the annealing, and a pile-up of the Si atoms is produced in the close proximity to the interface between the ion-implanted layer and the epitaxial layer (see a graph $g_1$ in FIG. 2). Then, an impurity concentration in the vicinity of the interface is higher than a peak concentration in an impurity distribution when forming the ion-implanted layer, and, hence, the interface between the ion-implanted layer and the epitaxial layer becomes unstable thermally enough to induce a fluctuation in terms of a threshold voltage. Further, if this pile-up is produced, a resistance value of the high-resistance epitaxial layer decreases, thereby bringing about a reduction in the gate/drain withstand voltage.

Figure 2:
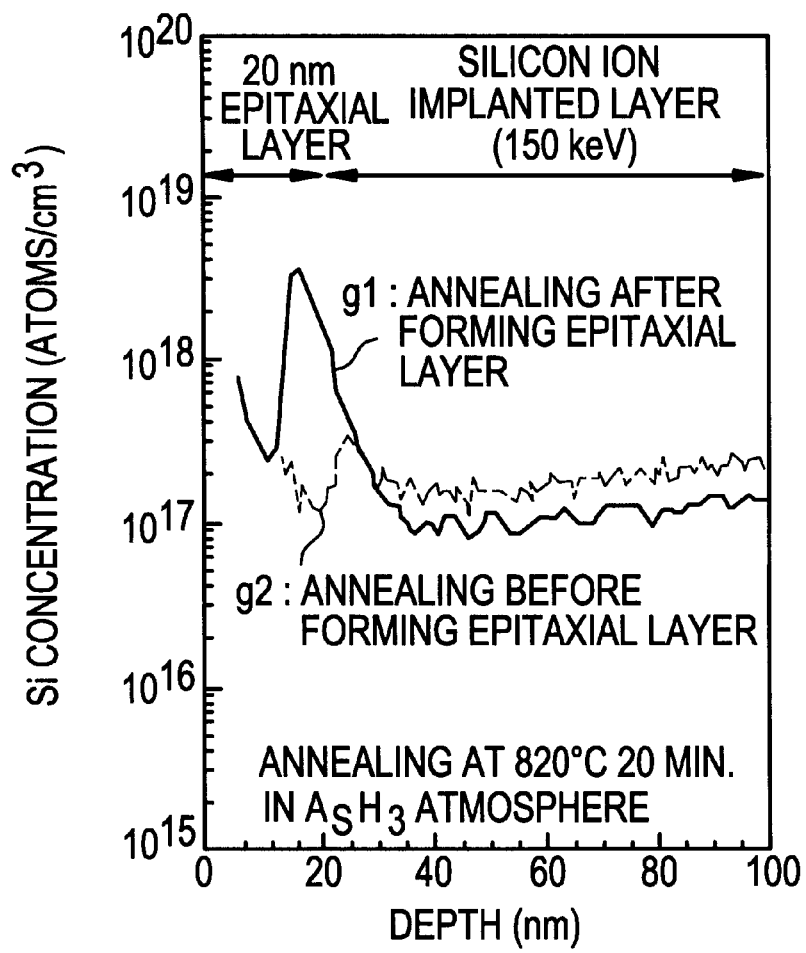
FIG. 2 is a graph of assistance in explaining an effect of the embodiment.

Note that the graph of FIG. 2 shows a profile of the Si atoms in the vicinity of the interface between the epitaxial layer and the ion-implanted layer, wherein this profile is obtained by use of SIMS (Secondary-Ion Mass Spectroscopy). A thickness of the epitaxial layer at this time is 20 nm, and the anneal is performed at 820° C. for 20 minutes in the $AsH_3$ atmosphere.

A graph $g_2$ of FIG. 2 illustrates a profile of the Si atoms in a case where as in this embodiment, after effecting the anneal for removing the crystalline defects on the surface of the ion-implanted layer 3 without any protecting film, the epitaxial layer is formed, and, subsequently, the anneal for activating the ion-implanted layer 3 is executed. Both in the graph $g_1$ and in the graph $g_2$, the ions are implanted so that a peak concentration within the ion-implanted layer comes to $1.2 \times 10^{18}$ $cm^{-3}$. As known from graph $g_2$, when performing the anneal without the protecting film before forming the epitaxial layer as in this embodiment, the impurity (Si) concentration in the vicinity of the interface between the ion-implanted layer and the epitaxial layer is on the order of $1.8 \times 10^{17}$ $cm^{-3}$ or under, i.e., can be restrained down to 15% of a peak impurity concentration ($1.2 \times 10^{18}$ $cm^{-3}$) of a corresponding-to-channel region (ion implanted layer). Contrastingly, according to a method disclosed in Japanese Patent Laid-Open Publication No. 62-286284, because of producing the pile-up of the Si atoms, the highest concentration of the Si atoms decreases at the same time, the Si atoms are accumulated on the interface between the ion-implanted layer and the epitaxial layer. Then, a concentration of the Si atoms in the vicinity of this interface is $1 \times 10^{18}$ $cm^{-3}$ or more (see graph $g_1$). With this process, as in this embodiment, the anneal for removing the crystalline defects on the surface of the ion-implanted layer is effected before forming the epitaxial layer 4, thereby making it possible to obtain both a thermally-stable interface and a high-quality epitaxial layer. Accordingly, the gate/drain withstand voltage can be improved, and a predetermined threshold value can be obtained when incorporated into a circuit.

According to the inventors' knowledge, if the impurity concentration at the interface between the ion-implanted layer and the epitaxial layer exceeds 45% of the peak impurity concentration of the channel layers, it is impossible to obtain a thermally stable interface, that is, high quality epitaxial layer, and as a result, desired electrical characteristics for being integrated cannot be obtained. Consequently, the inventors think that impurity concentration of the channel layers at the interface must be 45% or under of the peak concentration of the channel layers. In the above-mentioned embodiment, the impurity concentration at the interface between the ion-implanted layer and the epitaxial layer is 15% of the peak impurity concentration of the channel layers (ion implanted layer). Using the method according to the embodiment, it is possible to make the impurity concentration at the interface 45% or under of the peak concentration of the channel layers. It is to be noted that 45% or under can not be obtained by the conventional arts and that the method according to the present invention is the only method to obtain 45% or under.

A mutual conductance $g_m$ of the transistor manufactured in accordance with this embodiment is 300 mS/mm, which is substantially the same value as manufacturing it by use of only the ion implantation method.

Further, with respect to an element-to-element electric isolation, an electric current when applying 5V (power voltage is 2.7 V) across an element-to-element gap of 1.5 μm is 4 nA. This value is considerably small for MMIC used with the 2.7 V power supply but does not cause any trouble when highly integrated in the future.

Further, in the transistor manufactured in accordance with this embodiment, the epitaxial layer 4 composed of i-GaAs or i-Al$_x$Ga$_{1-x}$As is formed between the channel layer 3 and the gate electrode 5, and therefore noises can be reduced. In this embodiment, a minimum noise factor NF$_{min}$ of 0.4 dB or under (measured limit or below) at 2 GHz is obtained.

In contrast with this, when effecting no anneal for removing the crystalline defects on the surface of the ion-implanted layer before the epitaxial growth, the minimum noise factor NF at 2 GHz is 2 dB. Thus, the reason why the minimum noise factor NF$_{min}$ is large is, it can be considered, that the defects in the vicinity of the interface between the ion-implanted layer and the epitaxial layer causes a scatter of electrons and, in turn, causes the noise.

Note that the ions are implanted on the condition in which the dose is $5 \times 10^{12}$ cm$^{-2}$ when forming the n-type channel layer 3 in this embodiment. It is, however, required that the dose be on the order of $5 \times 10^{12}$ cm$^{-2}$ or less. If over $5 \times 10^{13}$ cm$^{-2}$, the crystalline defects on the surface of the ion-implanted layer (n-type channel layer 3) increase, and these defects can not removed even by effecting the anneal for removing the crystalline defects on the surface. For this reason, if the epitaxial growth is conducted on the ion-implanted layer, it is impossible to secure a good interface between the ion-implanted layer and the epitaxial layer.

Further, the arrangement that the n' intermediate concentration layer 7 is provided only on the source-side but is formed on the drain-side is intended to reduce the source resistance and, besides, obtain a high drain withstand voltage. Accordingly, the n' intermediate concentration layer 7 may possibly be provided on the drain-side according to the application.

Note that the material of the epitaxial layer involves the use of i-GaAs or i-Al$_x$Ga$_{1-x}$ in this embodiment, but i-In$_x$Ga$_{1-x}$ and p-type GaAs or p-type Al$_x$Ga$_{1-x}$As may also be employed.

Figure 3:
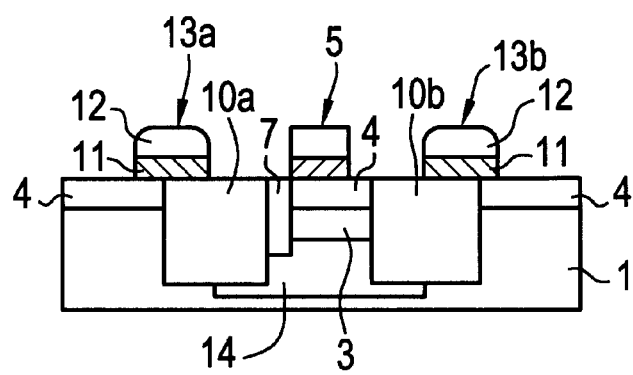
FIG. 3 is a sectional view illustrating a construction of a compound semiconductor field effect transistor manufactured in a second embodiment of the method of manufacturing the compound semiconductor field effect transistor of the present invention.
Figure 4A:
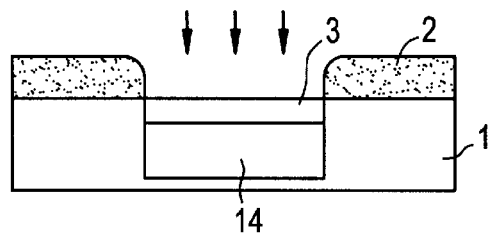
FIGS. 4A–4I are sectional views showing steps of a manufacturing process according to the second embodiment of the method of manufacturing the compound semiconductor field effect transistor of the present invention.
Figure 4B:
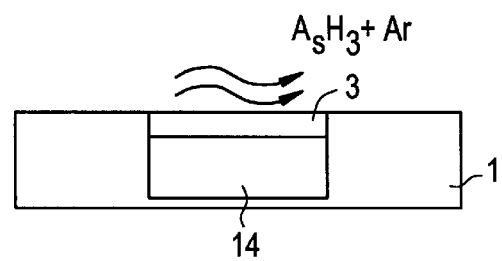
Figure 4C:
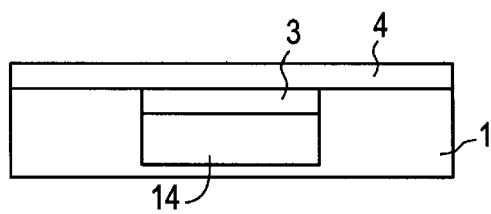
Figure 4D:
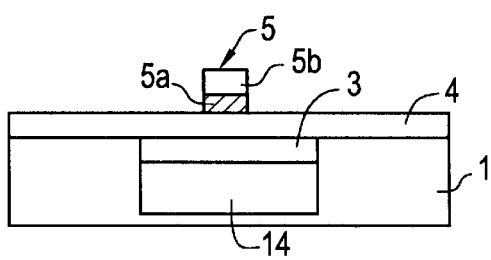
Figure 4E:
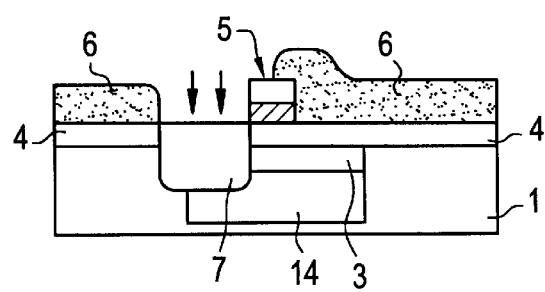
Figure 4F:
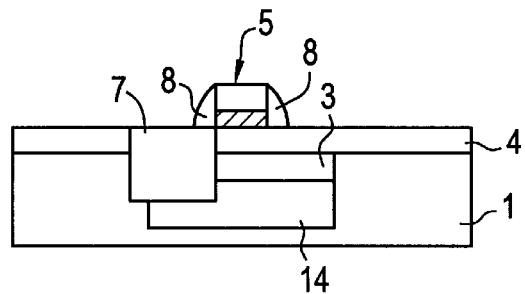
Figure 4G:
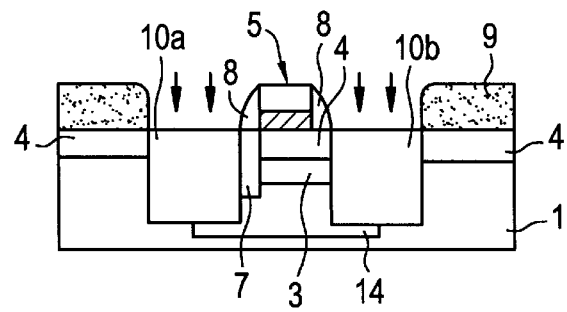
Figure 4H:
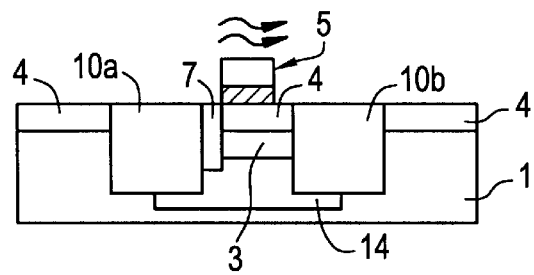
Figure 4I:
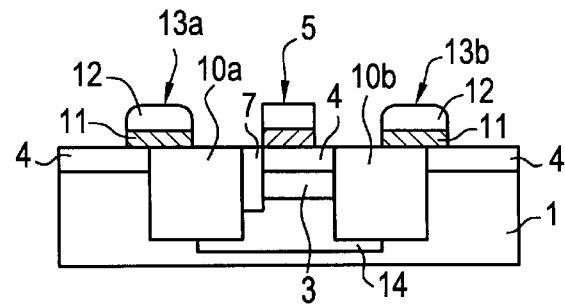

FIG. 3 illustrates a construction of a compound semiconductor field-effect transistor manufactured in accordance with a second embodiment of the compound semiconductor field effect transistor manufacturing method according to the present invention. The transistor manufactured by the manufacturing method in accordance with the second embodiment is constructed by providing a p-type region 14 under the n-type channel layer 3 in the transistor illustrated in FIG. 1I manufactured based on the manufacturing method in accordance with the first embodiment. FIGS. 4A–4I illustrate the steps of the manufacturing process according to the second embodiment. As shown in FIG. 4A, after sequentially forming the p-type ion-implanted layer 14 and the n-type ion-implanted channel layer 3, the process steps shown in 4B–4I are performed all the same as the corresponding steps illustrated in FIGS. 1B–1H of the first embodiment. Mg is ion-implanted into the p-type layer, wherein the acceleration voltage is 180 KeV, and the dose is $2 \times 10^{12}$ cm$^{-2}$.

The substrate current under the channel can be reduced in this second embodiment, and, hence, the short channel effect can be restrained greater than in the first embodiment.

Note that the material of the gate electrode involves the use of a heat-resistant refractory metal such as WN$_x$, W, etc. in the embodiments discussed above, but WSi or the like may also be employed.

According to the present invention, the gate/drain withstand voltage can be, even if integrated, enhanced, and, an inexpensive compound semiconductor field effect transistor can be manufactured.

It is apparent that, in this invention, a wide range of different working modes can be formed based on the invention without deviating from the spirit and scope of the invention. This invention is not restricted by its specific working modes except being limited by the appended claims.

What is claimed is:

1. A method of manufacturing a compound semiconductor field effect transistor comprising the steps of:

forming a channel layer by implanting ions into the surface of a semi-insulating compound semiconductor substrate;

performing a thermal treatment for removing crystalline defects on the surface of said channel layer;

forming a semiconductor epitaxial layer by use of an epitaxial method on a region covering said channel layer;

forming a gate electrode within a region on said epitaxial layer just above said channel layer; and forming source and drain regions in said substrate, wherein said epitaxial layer is formed by use of a material selected from the group consisting of intrinsic GaAs, intrinsic Al$_x$Ga$_{1-x}$As, intrinsic In$_x$Ga$_{1-x}$As, p-type GaAs, and p-type Al$_x$Ga$_{1-x}$As.

2. The method according to claim 1, wherein said forming said source and drain regions is conducted by an ion implantation using said gate electrode serving as an ion implantation mask.

3. The method according to claim 1, wherein said step of forming said source and drain regions includes substeps of:

forming an impurity region having the same conductivity as said channel layer or deeper than said channel layer in a predetermined source forming region so as to be contiguous to said gate electrode;

providing a side wall composed of an insulating film along a side surface of said gate electrode;

forming said source and drain regions exhibiting a higher concentration than said impurity region by ion-implanting an impurity with said gate electrode and said side wall serving as masks; and removing said side wall.

4. The method according to claim 1, wherein said semi-insulating compound semiconductor substrate is composed of GaAs, and said thermal treatment is performed at a predetermined temperature in such a manner that the surface of said ion-implanted layer is exposed in an As atmosphere.

5. The method according to claim 1, wherein the impurity in the case of forming said channel is Si, and the dose is on the order of $5 \times 10^{13}$ cm$^{-2}$ or under.

6. A method of manufacturing a compound semiconductor field effect transistor comprising the steps of:

forming a channel layer by implanting ions into the surface of a semi-insulating compound semiconductor substrate;

performing a first thermal treatment for removing crystalline defects on the surface of said channel layer; p1 forming a semiconductor epitaxial layer by use of an epitaxial method on a region covering said channel layer;

forming a gate electrode within a region on said epitaxial layer just above said channel layer;

forming source and drain regions in said substrate; and effecting a second thermal treatment for electrically activating said channel layer and said source and drain regions.

7. The method according to claim 6, wherein said forming said source and drain regions is conducted by an ion implantation using said gate electrode serving as an ion implantation mask.

8. The method according to claim 6, wherein said step of forming said source and drain regions includes substeps of:

forming an impurity region having the same conductivity as said channel layer but deeper than said channel layer in a predetermined source forming region so as to be contiguous to said gate electrode;

providing a side wall composed of an insulating film along a side surface of said gate electrode;

forming said source and drain regions exhibiting a higher concentration than said impurity region by ion-implanting an impurity with said gate electrode and said side wall serving as masks; and removing said side wall.

9. The method according to claims 6, wherein said semi-insulating compound semiconductor substrate is composed of GaAs, and said first thermal treatment is performed at a predetermined temperature in such a manner that the surface of said ion-implanted layer is exposed in an As atmosphere.

10. The method according to claim 6, wherein the impurity in the case of forming said channel is Si, and the dose is on the order of $5 \times 10^{13}$ cm$^{-2}$ or under.

11. The method according to claim 6, wherein said epitaxial layer is formed by use of a material selected from the group consisting of intrinsic GaAs, intrinsic $Al_xGa_{1-x}As$, intrinsic $In_xGa_{1-x}As$, p-type GaAs, and p-type $Al_xGa_{1-x}As$.

* * * * *